United States Patent
Naso

(10) Patent No.: US 7,254,756 B2
(45) Date of Patent: Aug. 7, 2007

(54) DATA COMPRESSION READ MODE FOR MEMORY TESTING

(75) Inventor: Giovanni Naso, Via Casilina Nord (IT)

(73) Assignee: Micron Technology, Inc., Boise, ID (US)

( * ) Notice: Subject to any disclaimer, the term of this patent is extended or adjusted under 35 U.S.C. 154(b) by 655 days.

(21) Appl. No.: 10/696,971

(22) Filed: Oct. 30, 2003

(65) Prior Publication Data

US 2004/0153599 A1 Aug. 5, 2004

(30) Foreign Application Priority Data

Jan. 31, 2003 (IT) .......................... RM2003A0040

(51) Int. Cl.
*G11C 29/00* (2006.01)
(52) U.S. Cl. ...................................... 714/718
(58) Field of Classification Search ................ 714/718, 714/719, 720, 710, 711
See application file for complete search history.

(56) References Cited

U.S. PATENT DOCUMENTS

| | | | |
|---|---|---|---|
| 5,966,388 A | | 10/1999 | Wright et al. |
| 6,016,561 A | * | 1/2000 | Roohparvar et al. ........ 714/720 |
| 6,032,274 A | * | 2/2000 | Manning .................... 714/718 |
| 6,550,026 B1 | | 4/2003 | Wright et al. |

* cited by examiner

*Primary Examiner*—James C Kerveros
(74) *Attorney, Agent, or Firm*—Leffert Jay & Polglaze, PA

(57) ABSTRACT

A first series combination of bit match circuits compares a predetermined bit position in data words that are involved in a compression operation. The first series combination compares the values in the predetermined bit position to determine if they are all a logical zero. A second series combination of bit match circuits compares the same predetermined bit position in the data words. The second series combination compares the values to determine if they are all a logical one. If either condition is true, the value of the bit is output through an output buffer. If both conditions are false, the output buffer is placed in a high impedance state to indicate an error condition exists in that bit position.

22 Claims, 5 Drawing Sheets

DATA COMPRESSION READ MODE FOR MEMORY TESTING

RELATED APPLICATION

This application claims priority to Italian Patent Application Serial No. RM2003A000040, filed Jan. 31, 2003, entitled "DATA COMPRESSION READ MODE FOR MEMORY TESTING," which is commonly assigned.

TECHNICAL FIELD OF THE INVENTION

The present invention relates generally to memory devices and in particular the present invention relates to data compression in a memory device.

BACKGROUND OF THE INVENTION

Integrated circuit memory devices typically include one or more arrays of memory cells that store data. The data is either read from or written to the memory cell using data communication connections. Some typical memory devices include random access memories (RAM), dynamic random access memories (DRAM), Synchronous DRAM (SDRAM), static RAM (SRAM), and non-volatile memories such as FLASH.

A memory data array is often internally organized as a page of data containing n words with each word containing a number of bits equal to the number of data communication connections (DQ's). During production of the memory devices, the individual memory cells need to be tested. One of the tests may be a write verification test.

The write verification test involves writing a known pattern of data (e.g., a pattern of ones and zeroes) to the memory array. The data can be read one word at a time and compared bit-by-bit to the pattern of data originally input to the memory array. If each bit in a particular position of each word of the output data matches the corresponding bit of the input pattern, the devices passes the test. A mismatch between any bit of any word of the output data and the input pattern indicates a failure.

A problem with such a test is that as the density of the memory arrays increase, the time needed to fully test the memory array also increases. Since the memory manufacturer has to test a large number of memory devices, even a small increase in test time multiplied by the large number of memory devices, creates a problem for the manufacturer.

One technique that can be used to decrease test time is data compression. Data read from multiple memory cells are compressed into a smaller number of data bits. Thus, less time is required for a given number of memory cells when implementing data compression. Data compression read circuitry is usually designed in such a way that does not affect the performance of write or read non-test operations. The data compression read path only operates in test mode and is in parallel to the non-test read path.

Typical data compression techniques are based on a ratioed logic approach to data compression. The ratioed logic approach is well know in the art and is not discussed further. Ratioed logic is typically limited to perform compression in a range of ten words. This limits the amount of compression that can be accomplished in order to reduce the testing time.

For the reasons stated above, and for other reasons stated below which will become apparent to those skilled in the art upon reading and understanding the present specification, there is a need in the art for an alternative data compression read scheme.

SUMMARY

The above-mentioned problems with data compression and other problems are addressed by the present invention and will be understood by reading and studying the following specification.

The various embodiments relate to a data compression read apparatus in a memory device. The apparatus has a first circuit that generates a first match signal if the $i^{th}$ bit of all of the words involved in a compression operation are equal to a logic zero. A second circuit generates a second match signal if the $i^{th}$ bit of all of the words involved in the compression operation are equal to a logic one. The first and second bit match signals are coupled to and control an output buffer that either lets the tested bit pass or creates a high impedance condition in response to the first and second match signals.

For one embodiment, the invention provides a first group of bit match circuits that are coupled in series in order to check the $i^{th}$ bit of the word involved in the compression operation. If the $i^{th}$ bits of each word are all a logic zero, the first group of bit match circuits outputs a logic one. A second group of bit match circuits are coupled in series in order to check the $i^{th}$ bit of the words involved in the compression operation. If the $i^{th}$ bits of each word are all a logic one, the second group of bit match circuits outputs a logic one. The output signals are logically ORed to control an output buffer such that the $i^{th}$ bit is transferred to the DQ connection if the bit passes the verification. If the bit does not pass the verification, the output buffer is placed into a high impedance state to indicate the failure of the bit.

Further embodiments of the invention include methods and apparatus of varying scope.

DETAILED DESCRIPTION

Figure 1:
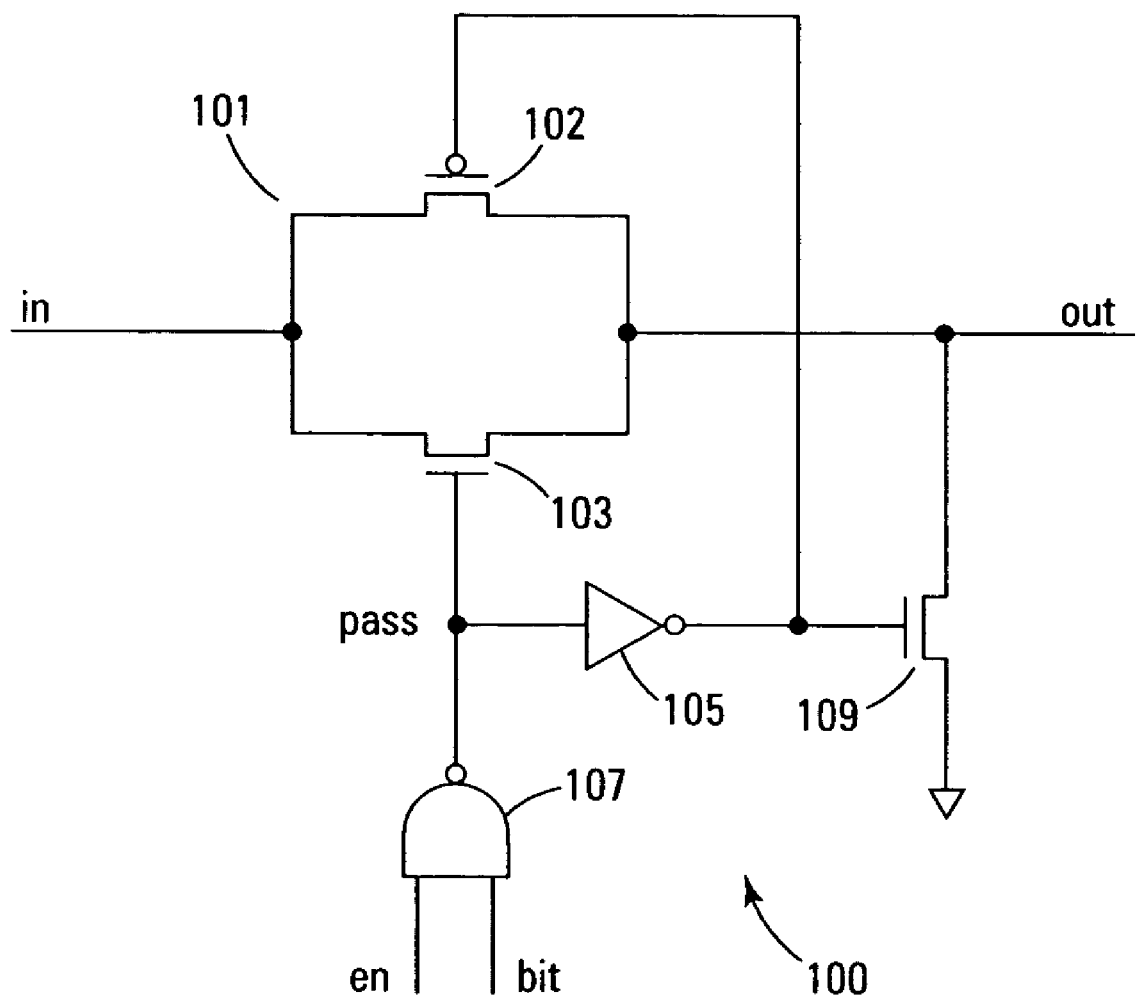
FIG. 1 shows a schematic of one embodiment of a single bit match circuit of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a schematic of one embodiment of a single bit match circuit 100 of the present invention. This circuit 100 provides one of two possible conditions. In one mode, the input "in" is shorted to the output "out". In another mode, the output is shorted to ground so that the circuit provides a logical zero output signal.

The bit match circuit 100 of the embodiment of FIG. 1 is comprised of a p-channel transistor 102 and an n-channel transistor 103. These transistors 102 and 103 are connected in parallel to form a complementary transfer gate 101 to connect the input to the output of the circuit 100. The gate of the n-channel transistor 103 is connected to the output signal of a NAND gate 107 that acts as a control input circuit. In this embodiment, the signal is labeled "pass". The gate of the p-channel transistor is connected to the output of an inverter 105 such that the inverse of the "pass" signal is connected to the p-channel transistor gate. In such an arrangement, both transistors 102 and 103 are either on or off at substantially the same time depending on the state of the "pass" signal.

The "pass" signal is generated by performing a logical NAND operation on two control signals. In this embodiment, these signals are an enable signal "en" and a bit signal "bit". Alternate embodiments may use other types of control signals.

The bit signal is one of the bits to be checked during the write verification test. This bit signal is one of a plurality of bits that comprise a word that is to be checked. In one embodiment, the word is comprised of sixteen bits. This bit signal is coupled to a particular memory cell of the memory device's memory array.

Figure 4:
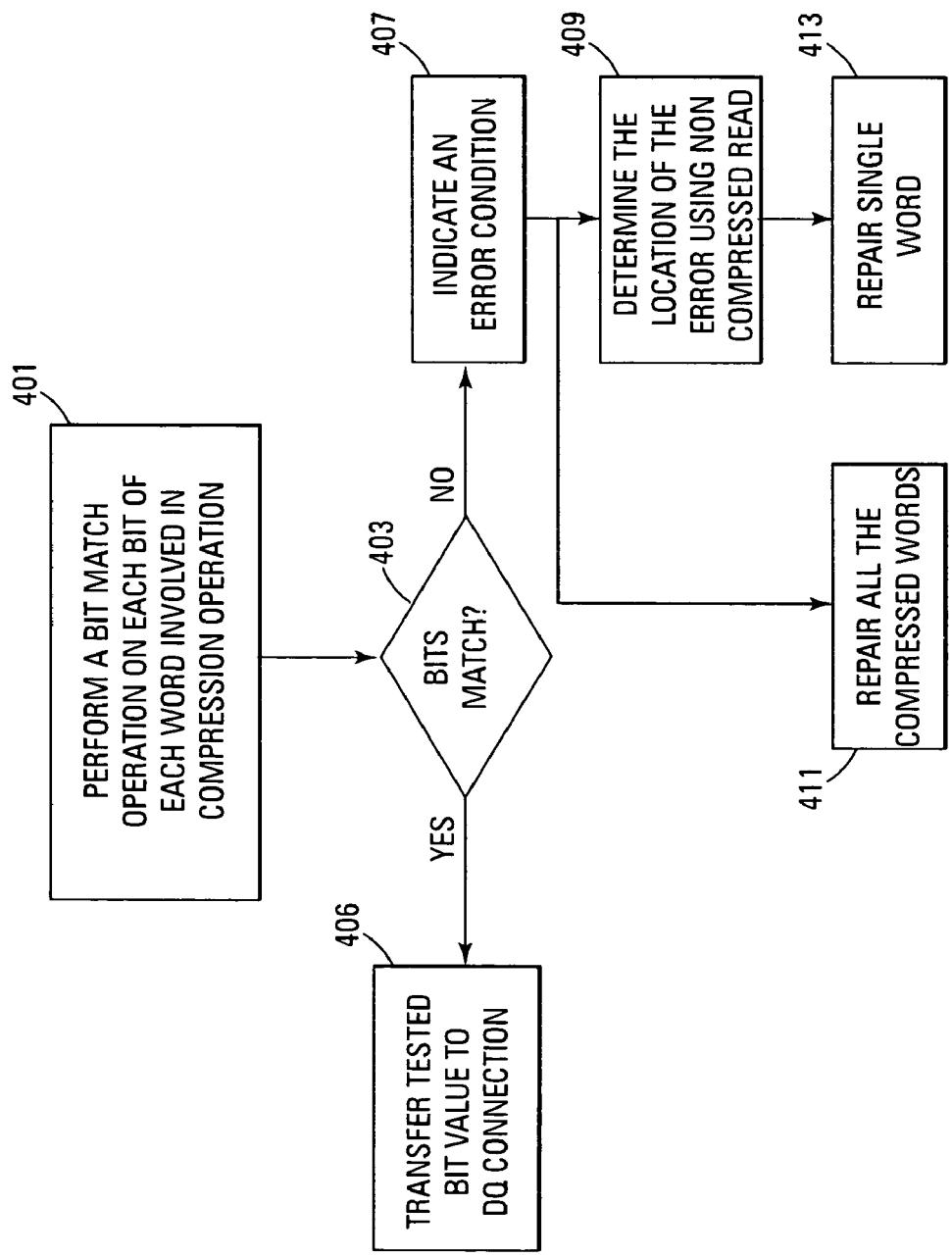
FIG. 4 shows a flow chart of one embodiment of a data compression read method of the present invention.

The enable signal is a word enable signal that is generated by memory device control circuitry as described subsequently with reference to FIG. 5. The enable signal indicates to the bit match circuitry 100 that the word of which the bit signal is a part is involved in a compressed read operation. The enable signal is generated as part of a read operation of the verification test that is executed by the control circuitry. One such read operation is illustrated in FIG. 4 as described subsequently.

In the embodiment of FIG. 1, when the enable signal is a logical one (i.e., en=1), the word to which the bit signal belongs is involved in the compressed read operation. When the enable signal is a logical zero (i.e., en=0), the word is not part of the compressed read operation.

If en=0, both of the transfer gate 101 transistors 102 and 103 are turned on and the input connection is coupled to the output connection through the parallel transistor combination 102 and 103. In this transfer mode, the value of the bit signal has no affect on the circuit. Any signal presented on the input connection while en=0 is transferred to the output connection.

If en=1, the state of the circuit 100 depends on the bit signal. In this case, if bit=0, both of the transfer gate 101 transistors 102 and 103 are turned on and a signal on the input connection is transferred to the output connection. If bit=1, both of the transfer gate 101 transistors 102 and 103 are turned off and the input connection is no longer coupled to the output connection. In this case, an n-channel transistor 109 acting as a switch and connected to the output connection is turned on to short the output connection to ground. This causes the output of the bit match circuit 100 to be a logical zero.

The embodiment of FIG. 1 illustrates just one possible implementation to perform the desired operations of the present invention. Alternate embodiments use other logic/circuit elements to achieve substantially the same result. For example, if the logic was inverted such that the enable signal is a logical zero when the word is involved in the compressed read operation, different elements may be required.

Figure 2:
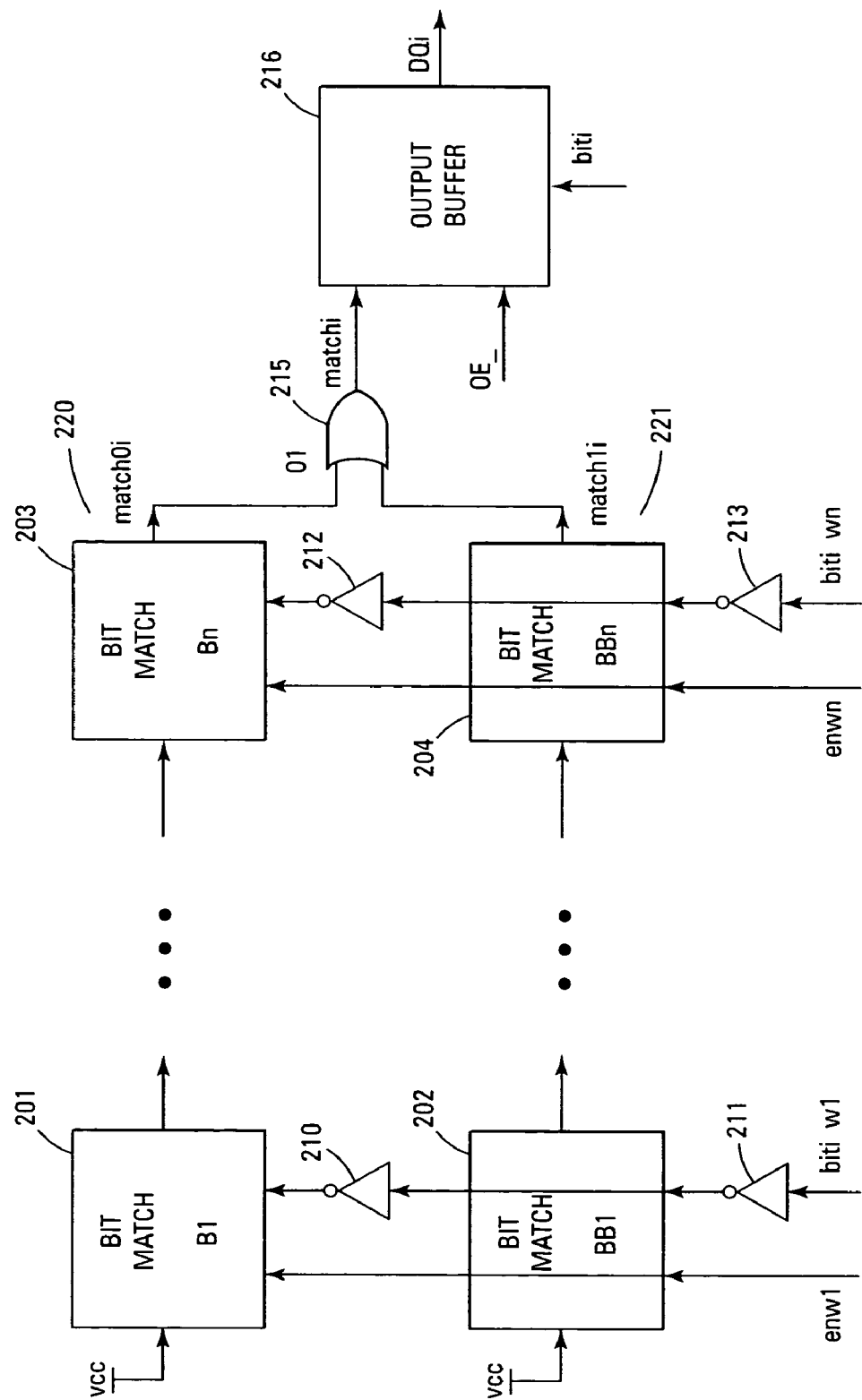
FIG. 2 shows a schematic of one embodiment of a data compression read mode apparatus of the present invention.

FIG. 2 illustrates a schematic of one embodiment of a data compression read mode apparatus of the present invention. This embodiment is comprised of a plurality of bit match circuits 201-204 connected in series that are substantially identical to the bit match circuit 100 of FIG. 1. In this embodiment, there are two bit match circuits 201-204 for each bit of each word involved in the compression operation. The schematic of FIG. 2 illustrates the portion of the apparatus required for the $i^{th}$ bit of each word. The schematic would be repeated for each bit (i.e., bit1-biti) of each word (i.e., w1-wn) that is involved in the compression operation.

In the embodiment of FIG. 2, the bit match circuits 201-204 are arranged such that series-coupled bit match circuits 201 and 203 (i.e., B1-Bn) generate a match signal labeled as "match0i". The input of the first bit match circuit 201 is coupled to $V_{cc}$. The output of each bit match circuit is coupled to a subsequent circuit's input. The final bit match circuit 203 in the series 220 outputs the "match0i" signal. As discussed subsequently, each of the bit match circuits 201 and 203 in this series 220 of bit match circuits 201 and 203 are coupled to the $i^{th}$ bit of data words w1-wn, from a memory array, that are involved in the compression operation.

Another series 221 of bit match circuits 202 and 204 (i.e., BB1-BBn) are coupled in series such that they generate a second match signal labeled as "match1i". The input of the first bit match circuit 202 is coupled to Vcc. The output of each bit match circuit is coupled to a subsequent circuit's input. The final bit match circuit 204 in the series 221 outputs the "match1i" signal. As discussed subsequently, each of the bit match circuits 202 and 204 in this series 221 of bit match circuits 202 and 204 are coupled to the $i^{th}$ bit of data words w1-wn.

The enable and control signals coupled to the $i^{th}$ bit match circuits 201-204 are an enable word signal (e.g., "enw1", "enw2"-"enwn") and the $i^{th}$ bit (e.g., "biti") of each word that is involved in the compression operation. The enable word signal is generated by the memory device's control circuitry. The $i^{th}$ bit from each word w1-wn is from the memory cell containing that particular data bit.

The "biti" signal of each data word is coupled to the "match0i" series 220 of bit match circuits 201 and 203 through two inverters 210 and 211 for the first word and inverters 212 and 213 for the last word. This has the effect of coupling the value of the $i^{th}$ data bit to each bit match circuit 201 and 203 of the "match0i" series 220. The "biti" signal of each data word is coupled to the "match1i" series 221 of bit match circuits 202 and 204 through a single inverter 211 for the first word and inverter 213 for the last word so that these bit match circuits 202 and 204 are controlled by the inverted $i^{th}$ bit. The operation of the "enw1"-"enwn" and "biti" signals with the bit match circuits 201-204 is discussed in greater detail with reference to FIG. 1 above.

In operation, if the $i^{th}$ bit of all the words involved in the compression operation are a logical zero and the "enw1"-"enwn" signals are a logical one, the "match0i" signal will be in a true state. In one embodiment, this state is a logical one. If at least one of the bits in the $i^{th}$ position of the compressed word is a logical one, the "match0i" signal will be in a false state. In one embodiment, this state is a logical zero.

If the $i^{th}$ bit of all the words involved in the compression operation are a logical one and the "enw1"-"enwn" signals are a logical one, the "match1i" signal will be in a true state. In one embodiment, this state is a logical one. If at least one of the bits in the $i^{th}$ position of the compressed word is a logical zero, the "match1i" signal will be in a false state. In one embodiment, this state is a logical zero.

The "match0i" signal and the "match1i" signal are input to a logical OR operation 215 such as a logical OR gate 215. If the $i^{th}$ bit of all the words involved in the compression operation have the same value, either "match0i" or "match1i" is in a true state (e.g., a logical one) and the output of the logical OR operation 215 (e.g., "matchi") will be in a true state (e.g., a logical one). If any of the $i^{th}$ bits are not the same value, "matchi" will be in a false state (e.g., a logical zero).

In one embodiment, the logical OR operation 215 is an OR gate. However, alternate embodiments use other logic elements to generate substantially similar results.

The output of the logical OR operation 215 is input as a control signal to an output buffer 216. This buffer 216 is the output buffer for the $i^{th}$ bit of the compressed word. The output of the buffer 216 is DQi for the memory device. The buffer has an additional control input labeled OE_ that goes low when the buffer is enabled by the control circuitry of the memory device. The $i^{th}$ bit that is being checked is input to the buffer 216 as the data to be output through the buffer 216.

Assuming the control circuitry has enabled the buffer 216, when the $i^{th}$ bit of all of the compressed words involved in the compression operation are equal and "matchi" is a logical zero, the buffer is enabled and the value of bit-i is allowed through the buffer 216. This allows the external testing device to read the DQi connection for the proper bit-i value to determine that the bit was successfully tested. If one of the $i^{th}$ bits of one of the compressed words is not the proper value, the "matchi" signal is a logical one and the buffer 216 is forced into a high impedance state. The external testing device can then detect this high impedance state and determine that the test failed.

The embodiment of FIG. 2 illustrates one way to perform a bit comparison of each respective bit in the words involved in a compression operation. Alternate embodiments use other circuits to accomplish substantially similar results.

Figure 3:
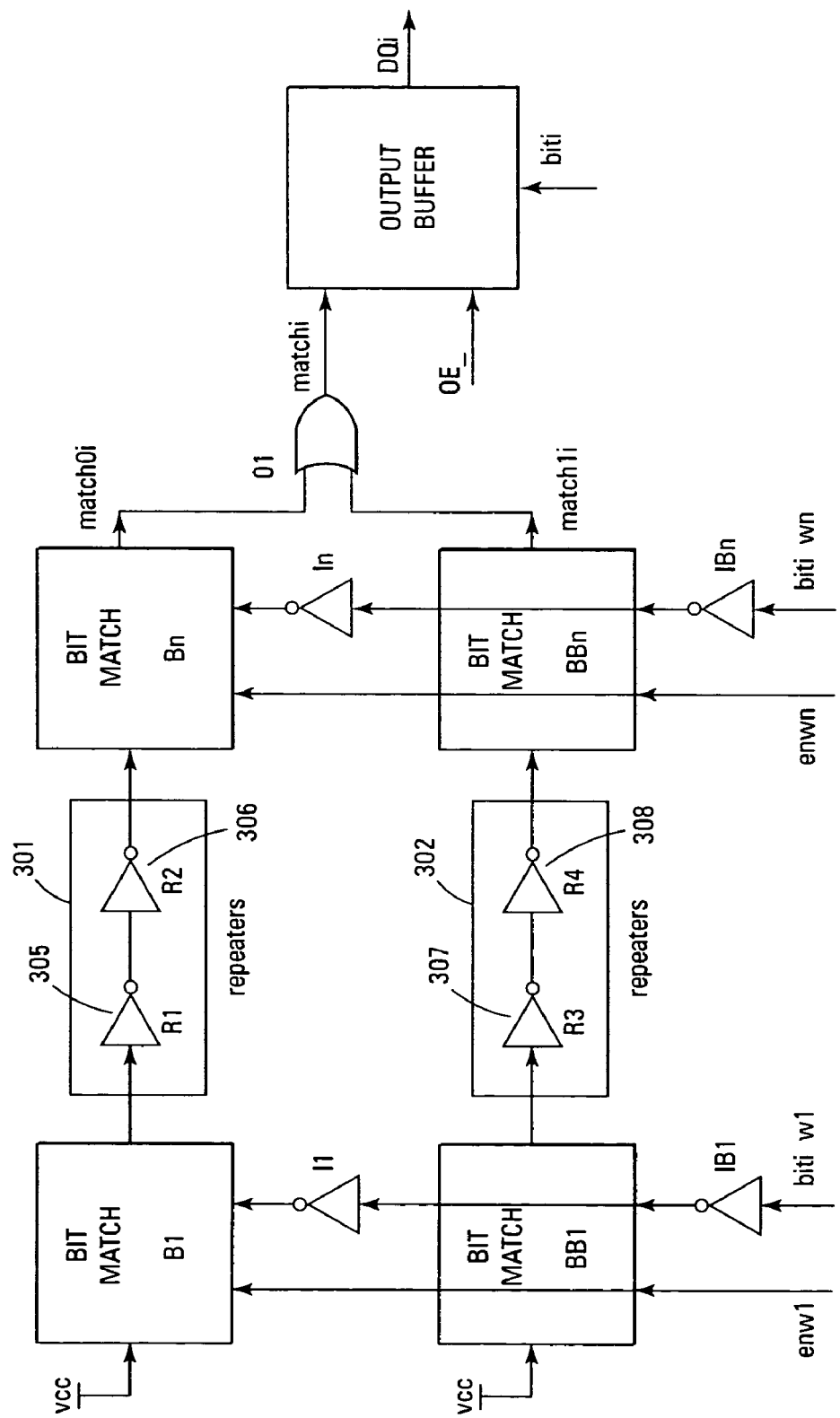
FIG. 3 shows a schematic of another embodiment of the data compression apparatus of the present invention.

Propagation delay through the series of bit match circuits 201-203 and 202-204 in FIG. 2 can be very high due to the fact that many bit match circuits in series represent a resistive path affected by MOS body effect and $V^{cc}$ needs to propagate along this path. FIG. 3 illustrates a schematic diagram of an alternate embodiment of the data compression read mode apparatus of the present invention to solve the speed degradation of the resistive path. This embodiment has substantially similar functionality as the embodiment of FIG. 2. This embodiment, however, has an additional repeater circuit 301 and 302 added along the series of bit match circuits that generate the "match0i" and "match1i" signals. The repeater circuits 301 and 302 are comprised, in one embodiment, of inverters 305-306 and 307-308, respectively. These elements 301 and 302 improve considerably the performance of the compressed read, thus reducing the propagation delay. In fact, the elements 301 and 302 break the resistive path; performing a strong driving of the signal. In one embodiment, the repeaters 301 and 302 are added every sixteen words. Alternate embodiments add them at different intervals. The discussion of FIG. 2 above illustrates the operation of the remainder of the embodiment of FIG. 3.

The embodiment of FIG. 3 illustrates one way to improve the propagation delay through each series of bit match circuits. Alternate embodiments use other circuits to accomplish substantially similar results.

FIG. 4 illustrates a flow chart of one embodiment of a data compression read method of the present invention. The method performs a bit match operation 401 on each of the bits of each word involved in the compression operation. In one embodiment, the $i^{th}$ bit of each word is checked with two series-coupled bit match circuits to determine if the $i^{th}$ bit is either all ones or all zeros. One series-coupled bit match circuit checks for all zeros while the second checks for all ones. If either is true, the bits match 403.

If all of the bits of the word match 403, the tested bit is allowed to be coupled to the DQ connection 405 of the memory device. In one embodiment, this may be accomplished by controlling an output buffer to which an input is the tested bit and a control signal is an indication from the bit match operation that the bit passed.

If any one of the bits of the word does not match 403, the tested bit is not allowed to be coupled to the DQ connection such that an error condition is indicated 407. In one embodiment, this may be accomplished by forcing the output buffer to a high impedance state. Thus any testing device reading that particular DQ connection will not read a high or low value.

Once it is determined that a bit is in error there may be no way to determine to which word the failing bit belongs. However, at least two strategies are possible to attempt to fix the failed bit using the row and/or column redundancy structures. The first strategy is to repair the failing bit location in all the compressed words 411 with a single repair operation. In this case, the test time is not increased but a lot of redundancy may be used. A second strategy is to exit from the compressed read test mode, read each word individually 409 to determine the location of the error, and repair the failing bit location of the particular word 413. In this case, the minimum redundancy is used but test time may be increased.

Figure 5:
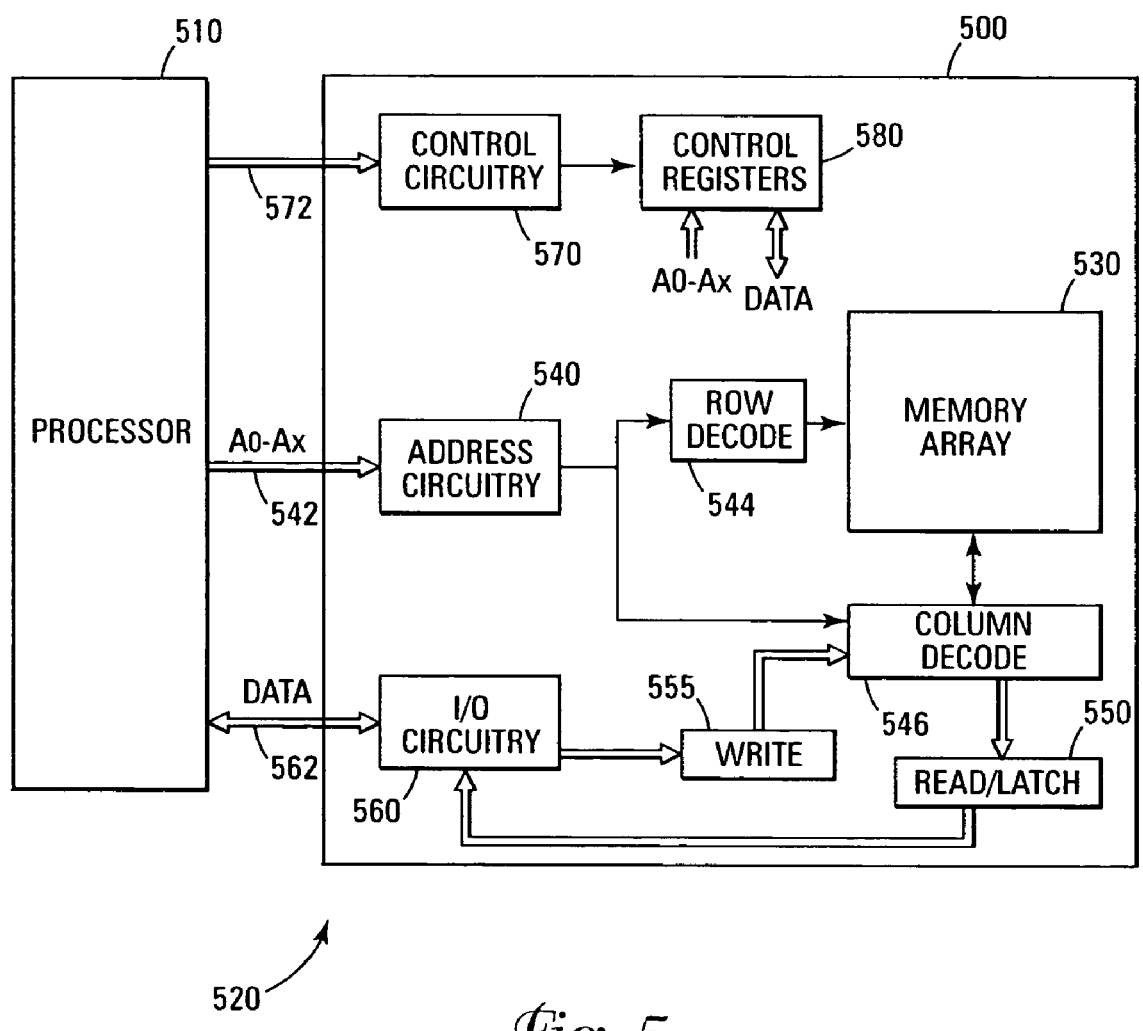
FIG. 5 shows a block diagram of one embodiment of a memory device of the present invention.

FIG. 5 illustrates a functional block diagram of one embodiment of a memory device 500 of the present invention. The memory device 500 may be coupled to a processor 510 to form part of an electronic system 520. The memory device 500 has been simplified to focus on features of the memory that are helpful in understanding the present invention. In one embodiment, the memory device is a flash memory device.

The memory device includes an array of memory cells 530. The memory cells are non-volatile floating-gate memory cells and the memory array 530 is arranged in banks of rows and columns. In one embodiment, the array of memory cells is comprised of a block of memory that makes up a predetermined address range in the memory array.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 using sense amplifiers to sense voltage or current changes in the memory array columns using read/latch circuitry 550. The read/latch circuitry 550, in one embodiment, is coupled to read and latch a row of data from the memory array 530. Data input and output buffer circuitry 560 is included for bi-directional data communication over a plurality of data connections (DQ) 562 with the processor 510. Write circuitry 555 is provided to write data to the memory array.

Command control circuit 570 decodes signals provided on control connections 572 from the processor 510. These signals are used to control the operations on the memory array 530, including data read, data write, and erase operations. In one embodiment, the control circuitry 570 is comprised of a state machine that executes the control functions of the memory device 500 and generates the enable word signals of the present invention.

An array of control registers 580 stores the commands and the control data. Some of the control registers are used for typical control functions and others may be reserved for expansion and/or future use.

The memory device illustrated in FIG. 5 has been simplified to facilitate a basic understanding of the features of the memory as they relate to the present invention. A more detailed understanding of internal circuitry and functions of flash memories and synchronous flash memories are known to those skilled in the art. Alternate embodiments of the memory device of FIG. 5 include other types of memory such as synchronous flash memory, NAND flash memory, NOR flash memory, other types of non-volatile memory, or any other type of memory that needs to be tested.

CONCLUSION

The present invention overcomes the compressed word limitation typical of the prior art while keeping the propagation delay the same as or less than a typical prior art value. Using a building block approach with bit match circuits to compare each respective bit of the compressed words, the present invention avoids the problems inherent to the ratioed logic schemes of the prior art. The $i^{th}$ bit of each word that is involved in the compression operation is checked to determine if it matches the other respective bits. The bit is checked for either a logic one state or a logic zero state. If the respective bits are the same value, the bit is transferred to its output connection. If one of the respective bits is different, indicating a bad memory cell, the output connection is placed into a high impedance state.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A data compression read apparatus in a memory device, the apparatus comprising:
   a first circuit that generates a first match signal when a predetermined bit of each of a plurality of data words are a logical zero, the first circuit comprising a plurality of bit match circuits each having a complementary transfer gate controlled by a logical combination of the predetermined bit and an enable signal;
   a second circuit that generates a second match signal when the predetermined bit of each of the plurality of data words are a logical one, the second circuit comprising a plurality of bit match circuits each having a complementary transfer gate controlled by a logical combination of the predetermined bit and the enable signal; and
   an output buffer circuit that either passes the predetermined bit or is in a high impedance state in response to the first or second match signals.

2. The apparatus of claim 1 wherein the first circuit generates a logical true state when the predetermined bit position is a logical zero.

3. The apparatus of claim 1 wherein the second circuit generates a logical true state when the predetermined bit position is a logical one.

4. The apparatus of claim 1 and further including a logical OR operation coupled to the first and the second match signals such that the logical OR operation generates a match signal when one of the first or the second match signals is in a logical true state, the match signal coupled to and controlling a state of the output buffer circuit such that the output buffer circuit passes the predetermined bit when the match signal is true and places the output buffer circuit in the high impedance state when the match signal is false.

5. The apparatus of claim 1 wherein the memory device is a flash memory device.

6. A data compression read apparatus in a memory device, the apparatus comprising:
   a first series of bit match circuits that generates a first match signal for indicating whether a predetermined bit position of each of a plurality of data words are a logical zero;
   a second series of bit match circuits that generates a second match signal for indicating whether the predetermined bit position of each of the plurality of data words are a logical one, wherein each bit match circuit comprises:
      a first transistor having an input connection, an output connection, and a first control gate;
      a second transistor coupled in parallel to the first transistor, the second transistor having a second control gate;
      a third transistor coupled between ground and the output connection, the third transistor having a third control gate; and
      a control input circuit having an enable signal and the predetermined bit as inputs, the control input circuit generating a control signal output coupled to the first, second, and third control gates such that an input signal on the input connection is routed to the output connection when the control signal is in one state and the output connection is grounded when the control signal is in a second state; and
   an output buffer circuit coupled to the first and second series of bit match circuits such that the output buffer outputs the predetermined bit when either the first or the second match signals indicate a true state and the output buffer being in a high impedance state in response to the first or second match signals indicating a false state.

7. The apparatus of claim 6 wherein the true state is a logical one and the false state is a logical zero.

8. The apparatus of claim 6 wherein the first transistor is a p-channel transistor and the second transistor is an n-channel transistor.

9. The apparatus of claim 6 wherein the first state is a logic one and the second state is a logic zero.

10. A data compression read apparatus in a flash memory device, the apparatus comprising:
a first series of bit match circuits that generates a first match signal for indicating when a predetermined bit position of each of a plurality of data words are a logical zero, the first series of bit match circuits comprising a plurality of bit match circuits each having a complementary transfer gate controlled by a logical combination of the predetermined bit and an enable signal;
a second series of bit match circuits that generates a second match signal for indicating when the predetermined bit position of each of the plurality of data words are a logical one, the second series of bit match circuits comprising a plurality of bit match circuits each having a complementary transfer gate controlled by a logical combination of the predetermined bit and the enable signal;
a logical OR operation having inputs coupled to the first and second match signals, the logical OR operation generating a true indication when one of the first or second match signals indicates a true state and a false indication otherwise; and
an output buffer circuit coupled to the logical OR operation such that the output buffer passes the predetermined bit in response to the true indication and the output buffer being in a high impedance state in response to the false indication.

11. The apparatus of claim 10 wherein the logical OR operation comprises a logical OR gate.

12. A bit match circuit comprising:
a first transistor having an input connection, an output connection, and a first control gate;
a second transistor coupled in parallel to the first transistor, the second transistor having a second control gate;
a switching device coupled between ground and the output connection, the switching device having a control input; and
a control input circuit having an enable signal and a predetermined data bit as inputs, the control input circuit generating a control signal output coupled to the first and second control gates and the control input such that an input signal on the input connection is routed to the output connection when the control signal is in a first logical state and the output connection is grounded when the control signal is in an inverse logical state.

13. The circuit of claim 12 wherein the first logical state is a logical one and the inverse logical state is a logical zero.

14. The circuit of claim 12 wherein the first transistor and the switching device are n-channel transistors and the second transistor is a p-channel transistor.

15. The circuit of claim 12 wherein the predetermined data bit is a data bit from a data word involved in a compression operation in a memory device.

16. A method for performing a compressed read operation in a memory device having an output buffer, the method comprising:
combining a first plurality of bit match circuits in series such that each bit match circuit is coupled to a predetermined bit of a plurality of data words, each bit match circuit having a complementary transfer gate controlled by a logical combination of the predetermined bit and an enable signal;
combining a second plurality of bit match circuits in series such that each bit match circuit is coupled to the predetermined bit of the plurality of data words, each bit match circuit having a complementary transfer gate controlled by a logical combination of the predetermined bit and the enable signal;
performing a logical zero bit match operation on a plurality of predetermined bits in the predetermined bit location with the first plurality of bit match circuits;
performing a logical one bit match operation on the plurality of predetermined bits with the second plurality of bit match circuits;
if the plurality of predetermined bits in each of the plurality of data words have a same value, enabling transfer of the value through the output buffer; and
if the plurality of predetermined bits in each of the plurality of data words do not have the same value, causing the output buffer to be in a high impedance state.

17. An electronic system comprising:
a processor that controls the operation of the electronic system; and
a memory device coupled to the processor, the memory device having a data compression read apparatus comprising:
a first circuit that generates a first match signal when a data bit in a predetermined bit position of each of a plurality of data words are a logical zero, the first circuit comprising a plurality of bit match circuits each having a complementary transfer gate controlled by a logical combination of the predetermined bit and an enable signal;
a second circuit that generates a second match signal when the data bit in the predetermined bit position of each of the plurality of data words are a logical one, the second circuit comprising a plurality of bit match circuits each having a complementary transfer gate controlled by a logical combination of the predetermined bit and the enable signal; and
an output buffer circuit that either passes the data bit or is in a high impedance state in response to the first or second match signals.

18. A data compression read apparatus in a memory device, the apparatus comprising:
a first series of bit match circuits that generates a first match signal for indicating when a predetermined bit position of each of a plurality of data words are a logical zero;
a second series of bit match circuits that generates a second match signal for indicating when the predetermined bit position of each of the plurality of data words are a logical one;
a plurality of propagation repeater circuits that regenerate the first and second match signals, a first propagation repeater circuit coupled between a predetermined number of the first series of bit match circuits and a second propagation repeater circuit coupled between a predetermined number of the second series of bit match circuits; and
an output buffer circuit coupled to the first and second series of bit match circuits such that the output buffer outputs the predetermined bit when either the first or the second match signals indicate a true state and the output buffer being in a high impedance state in response to the first or second match signals indicating a false state.

19. A method for performing a compressed read operation in a memory device having an output buffer, the method comprising:
performing a bit match operation on a data bit at a predetermined bit of each word involved in the compressed read operation, the bit match operation performed by a complementary transfer gate controlled by a logical combination of the predetermined bit and an enable signal;

if the data bits in each of the predetermined bit location in each word are equal, enabling transfer of the data bit through the output buffer; and if the data bits in each of the predetermined bit locations in each word are not equal, determining the predetermined bit location of the word that is causing an error condition.

20. The method of claim 19 wherein the predetermined bit location is determined by exiting the compressed read operation.

21. The method of claim 20 and further including repairing the error condition.

22. The method of claim 19 and further including repairing each word.

* * * * *